United States Patent
Park et al.

(10) Patent No.: US 7,423,282 B2
(45) Date of Patent: Sep. 9, 2008

(54) MEMORY STRUCTURE AND METHOD OF MANUFACTURE

(75) Inventors: Chanro Park, Samois sur Seine (FR); Wolfgang Raberg, Fontainebleau (FR); Ulrich Klostermann, Fontainebleau (FR)

(73) Assignees: Infineon Technologies AG, Munich (DE); Atlis Semiconductor, Corbeil Essonnes Cedex (FR)

( * ) Notice: Subject to any disclaimer, the term of this patent is extended or adjusted under 35 U.S.C. 154(b) by 0 days.

(21) Appl. No.: 11/483,264

(22) Filed: Jul. 6, 2006

(65) Prior Publication Data

US 2008/0006810 A1    Jan. 10, 2008

(51) Int. Cl.
*H01L 29/04* (2006.01)

(52) U.S. Cl. ............ 257/3; 257/4; 257/1; 257/E29.105; 257/48; 257/797

(58) Field of Classification Search ........................ None
See application file for complete search history.

(56) References Cited

U.S. PATENT DOCUMENTS

| | | | |
|---|---|---|---|
| 6,387,771 B1 * | 5/2002 | Genz et al. ................. | 438/386 |
| 6,713,379 B1 | 3/2004 | Ku et al. | |
| 6,713,802 B1 | 3/2004 | Lee | |
| 6,815,248 B2 | 11/2004 | Leuschner et al. | |
| 6,855,975 B2 * | 2/2005 | Gilton ......................... | 257/296 |
| 2002/0123170 A1 | 9/2002 | Moore et al. | |
| 2003/0129844 A1 * | 7/2003 | Wang et al. ................. | 438/694 |
| 2003/0199104 A1 | 10/2003 | Leuschner et al. | |
| 2005/0051820 A1 | 3/2005 | Stojakovic et al. | |
| 2005/0277299 A1 | 12/2005 | Le et al. | |

FOREIGN PATENT DOCUMENTS

| | | |
|---|---|---|
| DE | 10 2004 043 855 A1 | 5/2005 |
| DE | 11 2004 001 023 T5 | 4/2006 |
| KR | 2001094626 A * | 11/2001 |
| WO | WO 03/088253 A1 | 10/2003 |

\* cited by examiner

*Primary Examiner*—A. Sefer
*Assistant Examiner*—Scott R Wilson
(74) *Attorney, Agent, or Firm*—Slater & Matsil, L.L.P.

(57) ABSTRACT

A solid state electrolyte memory structure includes a solid state electrolyte layer, a metal layer on the solid state electrolyte layer, and an etch stop layer on the metal layer.

20 Claims, 4 Drawing Sheets

US 7,423,282 B2

MEMORY STRUCTURE AND METHOD OF MANUFACTURE

TECHNICAL FIELD

The present invention relates to a memory structure and more particularly to solid state electrolyte memory structures and a method of manufacturing thereof.

BACKGROUND

The patterning process of conductive bridging random access memory (CBRAM) elements, also referred to as phase metallization cell (PMC) elements, is one of the key process steps when manufacturing a working CBRAM device.

In the integration scheme, usually a metal hard mask is provided in direct contact with the conductive bridging stack, which includes a chalcogenide layer including for example germanium selenide (GeSe) or germanium sulphide (GeS), and on the top of the chalcogenide layer, a silver layer, without any layer in-between the metal hard mask and the conductive bridging stack.

Usually, the metal hard mask layer is patterned using halogen plasma chlorine or fluorine. One problem with the patterning using halogen plasma, is that in this process silver (Ag) forms rather large agglomerations when it is exposed to the halogen plasma, which makes the conductive bridging stack etching step extremely difficult.

What is needed, therefore, is a memory structure in which the conductive bridging stack can be processed in a more reliable manner.

SUMMARY OF THE INVENTION

In accordance with one embodiment of the invention, a solid state electrolyte memory structure includes a solid state electrolyte layer, a metal layer on the solid state electrolyte layer, and an etch stop layer on the metal layer.

These and other features of the invention will be better understood in view of the following drawings and detailed description.

Figure 1:
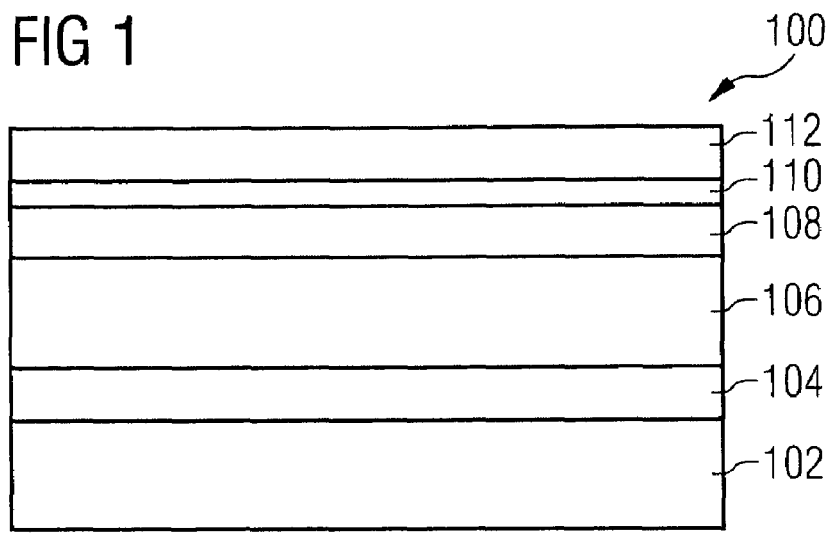
FIG. 1 illustrates a solid state electrolyte memory cell in accordance with a first exemplary embodiment of the invention.

For clarity, previously identified features retain their reference indicia in subsequent drawings.

DETAILED DESCRIPTION OF ILLUSTRATIVE EMBODIMENTS

In accordance with one embodiment of the invention, a solid state electrolyte memory structure includes a solid state electrolyte layer, a metal layer on the solid state electrolyte layer, and an etch stop layer on the metal layer.

In one embodiment of the invention, the solid state electrolyte memory structure further includes a hard mask layer, for example a metal hard mask layer, on the etch stop layer. The metal hard mask layer may be made of titanium (Ti), titanium nitride (TiN), tantalum (Ta), or tantalum nitride (TaN) or combination of these materials.

In another embodiment of the invention, the solid state electrolyte layer may be made of a chalcogenide material, wherein the chalcogenide material may contain metal ions. The metal ions can be selected from a group consisting of silver (Ag), cupper (Cu), zinc (Zn) or a combination or an alloy of these materials.

Furthermore, the chalcogenide material may, in accordance with an exemplary embodiment of the invention, be selected from a group consisting of sulphur (S), selenium (Se), germanium (Ge), tellurium (Te), tungsten (W) or a combination or an alloy of these materials.

The chalcogenide material may be formed of GeSe, GeS, $WO_x$, for example.

Furthermore, the metal layer may be made from a material containing silver.

In accordance with another exemplary embodiment of the invention, the etch stop layer may be made or may consist of a material that has a high etch resistance to hard mask etch chemistry. In other words, the etch stop layer may be made or may consist of a material that has an etch resistance higher than a predetermined threshold.

Furthermore, the etch stop layer may be selected such that it is also a diffusion barrier for the metal layer, in other words, for the material that is used for the metal layer.

By way of example, the etch stop layer may be made from a material selected from a group consisting of ruthenium (Ru), cobalt (Co), nickel (Ni), nickel iron (NiFe), nickel iron chrome (NiFeCr), platinum (Pt), platinum manganese (PtMn), iridium (Ir), iridium manganese (IrMn), or a combination or an alloy of these materials. Any other suitable material can be used for the etch stop layer if it provides a sufficiently high etch resistance to the used hard mask etch chemistry.

It is to be noted that these materials are specifically suitable for the etch stop layer in the case of a metal layer on chalcogenide containing silver. However, it should be mentioned that any other suitable material can be used for the etch stop layer in between the conductive bridging stack comprising the chalcogenide material, in other words, the ion conducting material, and the silver layer on the one hand, and the hard mask material on the other hand.

Some advantageous characteristics for the material that at least should partially be fulfilled are:

the etch stop layer material should be conductive;

the etch stop layer material should provide a high etch selectivity to the hard mask material during the hard mask opening etching process to allow a very thin layer to be used as the etch stop layer in the magnitude of a few nanometers, for example in the range of a thickness of 2 nm to 20 nm, for example 2 nm to 10 nm, for example 2 nm to 5 nm;

the etch stop layer material should provide a good adhesion with the conductive bridging stacks, in particular with the silver material that is used for the top layer of this conductive bridging stack, and the hard mask material, for example titanium nitride (TiN) or tantalum nitride (TaN);

the etch stop layer material should also serve as a diffusion barrier for the material of the top layer of the conductive bridging stack, for example silver, and for halogen species;

the etch stop layer material should provide a comparable or faster etching rate during the conductive bridging stack etching which follows the hard mask patterning;

the etch stop layer should provide a negligible or beneficial effect on the properties of the conductive bridging junction.

The above-mentioned material Ru, NiFe, NiFeCr, Pt, PtMn, Ir, IrMn, or the like fulfil all the above-mentioned requirements for TiN or TaN as the hard mask material and for Ag as the top layer of the conductive bridging stack.

As will be described in more detail below, the etch stop layer provided on the top layer of the conductive bridging stack and the hard mask layer provided on the etch stop layer enables a reliable etch stop when patterning the hard mask layer material on the etch stop layer, by which the Ag halogenide formation can be prevented.

In other words, in one embodiment of the invention, an etch stop layer is introduced on top of the conductive bridging stack, thereby improving the etch margin and avoiding contact of hard mask opening chemistry with conductive bridging stack material, for example with Ag.

In another embodiment of the invention, a memory structure is provided, comprising an ion conducting material, a metal layer on the ion conducting material layer, an etch stop layer on the metal layer, and a hard mask layer on the etch stop layer.

The hard mask layer may be a metal hard mask layer, and may be made of titanium (Ti), titanium nitride (TiN), tantalum (Ta), or tantalum nitride (TaN).

In accordance with another embodiment of the invention, the ion conducting material layer may be made of a chalcogenide material, wherein the ion conducting material may be made or consist of GeS, GeSe, $WO_x$.

Furthermore, the metal layer may be made from a material containing silver.

In another embodiment of the invention, the etch stop layer may be made from a material selected from a group consisting of Ru, NiFe, NiFeCr, Pt, PtMn, Ir, IrMn, or a combination or an alloy of these materials.

In accordance with another exemplary embodiment of the invention, a solid state electrolyte memory structure is provided, comprising a solid state electrolyte layer made of a chalcogenide material, a silver layer on the solid state electrolyte layer, an etch stop layer on the metal layer, the etch stop layer being made from a material selected from a group consisting of Ru, NiFe, NiFeCr, Pt, PtMn, Ir, IrMn, and a metal hard mask layer on the etch stop layer.

Furthermore, the metal hard mask layer may be made of titanium (Ti), titanium nitride (TiN), tantalum (Ta), or tantalum nitride (TaN).

In one embodiment of the invention, a method of manufacturing a solid state electrolyte memory structure is provided. A solid state electrolyte layer is formed and a metal layer is formed on the solid state electrolyte layer. An etch stop layer is formed on the metal layer and a hard mask layer on the etch stop layer. The hard mask layer is etched. The etching is stopped using the etch stop layer as an etch stop.

In one embodiment of the method in accordance with the present invention, forming the hard mask layer may include forming a metal hard mask layer.

Furthermore, the method may include forming a metal hard mask layer using a material being selected from a group consisting of titanium (Ti), titanium nitride (TiN), tantalum (Ta), or tantalum nitride (TaN).

In another embodiment of the invention, forming the solid state electrolyte layer may include the forming of a chalcogenide material, for example using a material being selected from a group consisting of sulphur (S), selenium (Se), germanium (Ge), tellurium (Te), tungsten (W) or a combination or an alloy of these materials.

Furthermore, forming the metal layer on the solid state electrolyte layer comprises in one embodiment of the invention forming the metal layer using a material containing silver.

Furthermore, forming the etch stop layer on the metal layer may comprise forming the etch stop layer using a material being selected from a group consisting of Ru, Co, Ni, NiFe, NiFeCr, Pt, PtMn, Ir, IrMn or a combination or an alloy of these materials.

FIG. 1 shows a conductive bridging memory cell 100 in accordance with a first exemplary embodiment of the invention.

On a substrate 102 made of silicon, for example, a bottom electrode 104, for example made of tungsten or tungsten silicide, is provided. Next, on the bottom electrode 104, ion conducting material 106, for example a chalcogenide as described above, is provided, following the deposition of a silver layer 108, which provides the metal ions being introduced into the ion conducting material 106 in a subsequent step, for example by means of photo diffusion or by means of annealing of the silver layer 108.

In one embodiment of the invention, an etch stop layer 110 made of Ru, Co, Ni, NiFe, NiFeCr, Pt, PtMn, Ir, IrMn or the like is provided on the silver layer 108, the etch stop layer 110 having a thickness of a few nanometres, for example 2 nm to 20 nm, for example 2 nm to 10 nm, for example 2 nm to 5 nm.

Then, a metal hard mask, for example made of TiN or TaN 112 is provided on the etch stop layer 110.

As will be shown with reference to FIG. 2a to FIG. 2k, the metal hard mask layer 112 will be patterned using hard mask opening etching chemistry, with the plasma etch process being stopped on the etch stop layer 110, thereby protecting the silver layer 108 and preventing the formation of silver agglomerates.

FIGS. 2a to 2k show the process of manufacturing of a solid state electrolyte memory cell arrangement comprising a plurality of memory cells, wherein, for reasons of clarity, only two memory cells are shown. However, an arbitrary number of hundreds, thousands or millions of memory cells can be provided in the solid state electrolyte memory cell arrangement, the cells being arranged, for example, in an array, for example in a matrix in rows and columns. It is to be noted that for reasons of simplicity, only the memory cell units are described and shown in the figures. However, the so called front end of line (FEOL) module that includes transistors, word lines, and bit lines are not depicted in the drawings. In one embodiment of the invention, the described CBRAM memory cells are coupled to the source/drain regions of the respective transistors through vias, which are electrically coupled to the bottom electrodes 214, which will be described in more detail below. For example, the vias are holes in an electrically insulating dielectric film, like low-k material, silicon oxide ($SiO_2$), silicon nitride ($Si_3N_4$), or the like.

Figure 2A:
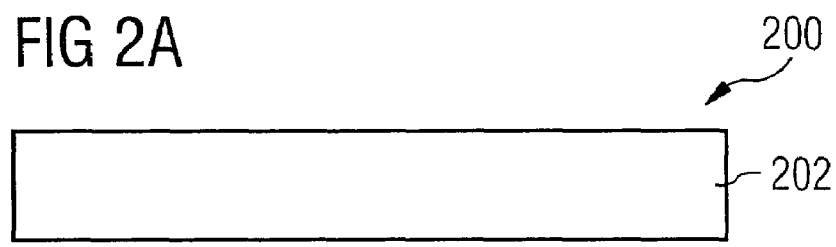
FIGS. 2a to 2k illustrate a process of manufacture of a solid state electrolyte memory cell arrangement in accordance with a second exemplary embodiment of the invention.

As shown in a first structure 200 in FIG. 2a, a layer 202 made of a dielectric material is provided, under which FEOL module which is not shown in the figures.

Figure 2B:
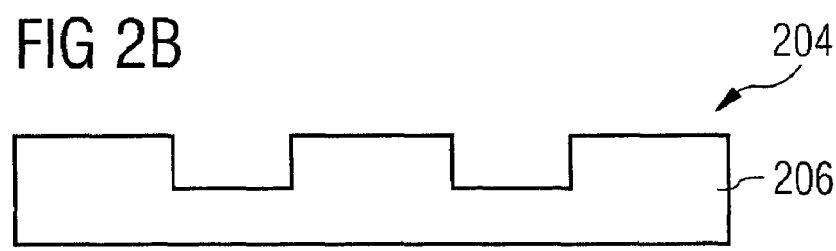

In a following step, as shown in a second structure 204 in FIG. 2b, in accordance with a common damascene process, the substrate 202 is patterned, thereby forming trenches in the patterned substrate 206, wherein, as will be described in more detail below, the bottom electrodes of the conductive bridging memory cells will be formed.

Figure 2C:
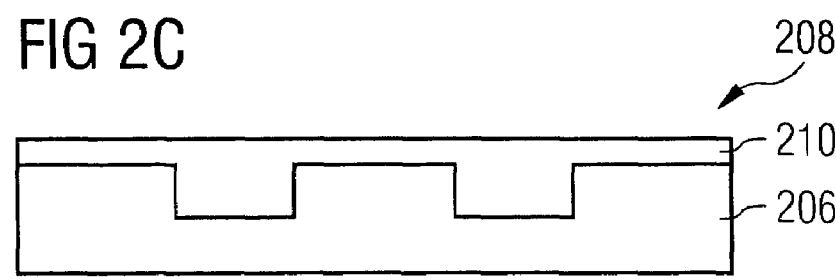

As shown in a third structure 208 in FIG. 2c, the trenches are filled and possibly overfilled with a metal 210. In accordance with an embodiment of the invention, the metal can be tungsten (W), tungsten silicide (WSi), or copper (Cu). In an alternative embodiment of the invention, the trenches are filled and possibly overfilled with doped polysilicon by means of a deposition process, for example by means of a chemical vapour deposition process or a physical vapour deposition or a electrochemical deposition.

Figure 2D:
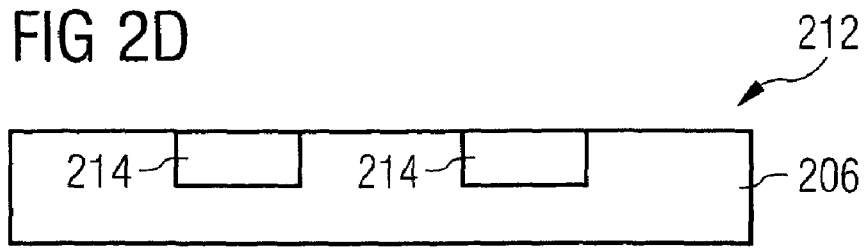

Next, the overfilling material of the metal will be removed by means of a chemical mechanical polishing (CMP) process, such that the CMP will be stopped on the upper surface of the patterned substrate 206, thereby electrically isolating the bottom electrodes 214 (also referred to as first electrodes 214 in the following) from one another (see fourth structure 212 in FIG. 2d).

Figure 2E:
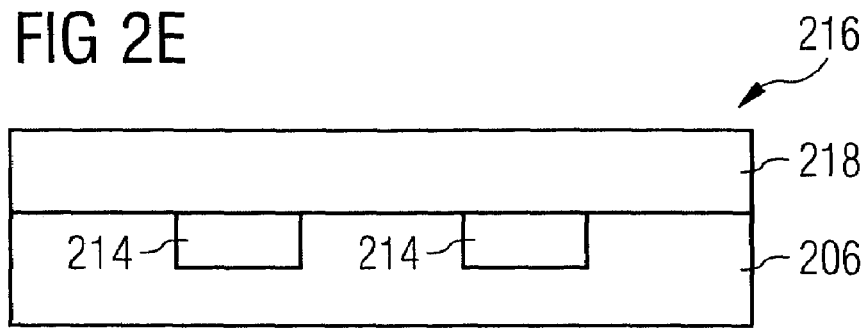

After having formed the bottom electrodes 214, chalcogenide material (i.e., ion conducting material), for example GeSe, GeS, $WO_x$, or the like, is provided on the upper surface of the patterned substrate 206 and the exposed upper surfaces of the first electrodes 214, thereby forming a chalcogenide layer 218 (see fifth structure 216 in FIG. 2e).

Figure 2F:
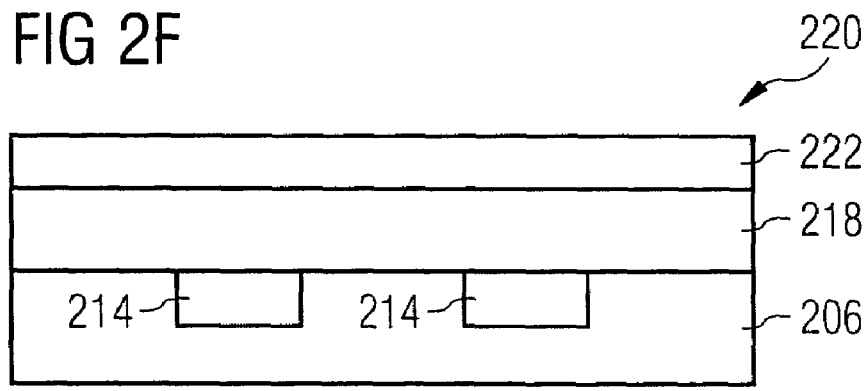

Next, a silver layer 222 is deposited on the chalcogenide layer 218 as shown in a sixth structure 220 in FIG. 2f.

Figure 2G:
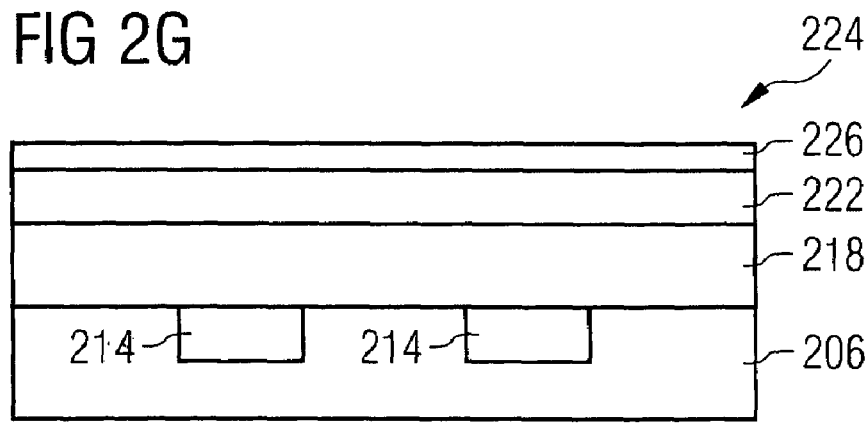

Then, an etch stop layer 226 as described above, is deposited on the silver layer 222, the etch stop layer 226 being deposited with a layer thickness of a few nanometres, for example with a layer thickness of 2 nm to 5 nm (see seventh structure 224 in FIG. 2g).

Figure 2H:
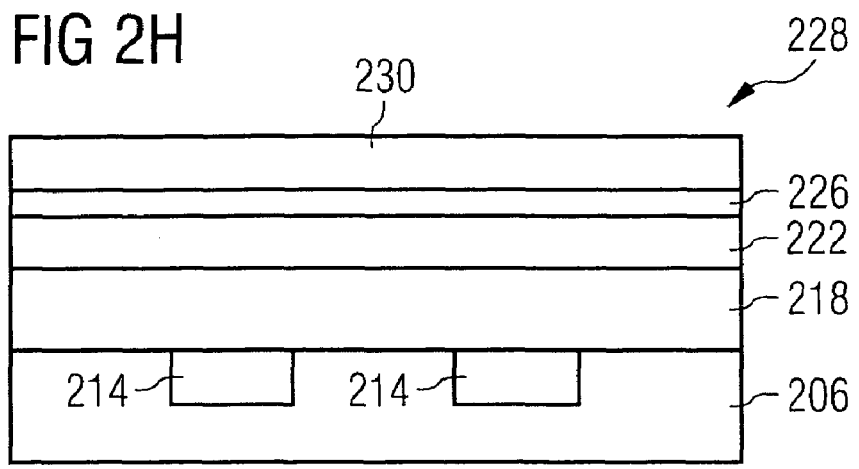

As shown in FIG. 2h, in one embodiment of the invention, a metal hard mask layer 230 made of TiN or TaN is deposited on the etch stop layer 226 (see eighth structure 228 in FIG. 2h).

Figure 2I:
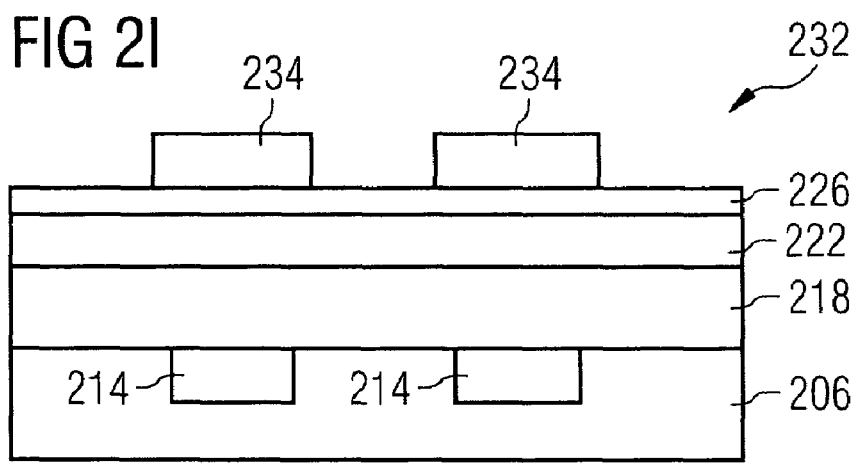

Then, in order to prepare the etching of the conductive bridging stacks, the metal hard mask layer 230 is patterned, thereby forming a patterned hard mask layer 234 as shown in the ninth structure 232 in FIG. 2i.

The hard mask layer 230 is patterned in such a way that the remaining portions of the patterned hard mask layer 234 are located above the first electrodes 214 in order to protect them during the following etching process for etching the conductive bridging memory cells. The first electrodes 214 and the remaining portions of the patterned hard mask layer 234 overlap each other at least partially in a lateral direction.

Figure 2J:
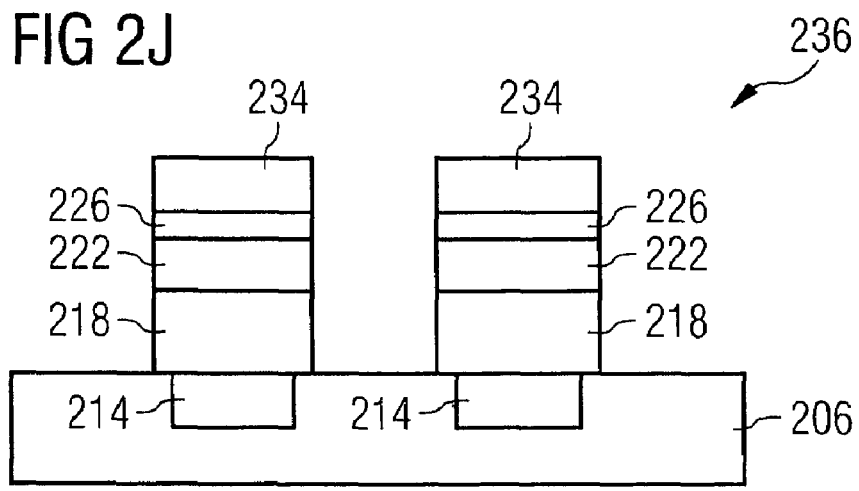

As shown in FIG. 2j (see tenth structure 236) another etching process is performed, thereby etching through the etch stop layer 226 the silver layer 222 and the chalcogenide layer 218, the etching process being stopped on the upper surface of the patterned substrate 206.

Figure 2K:
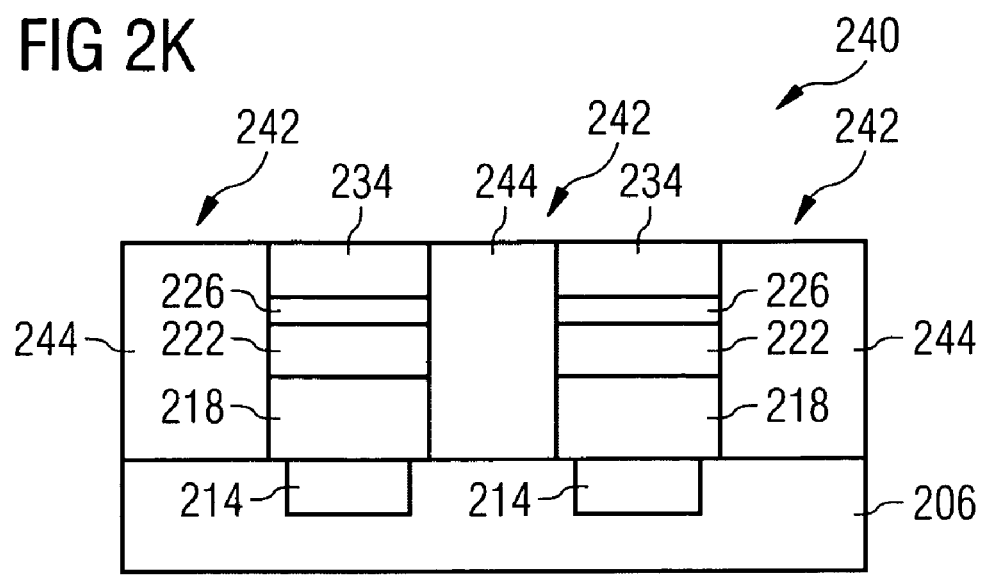

As shown in the eleventh structure 240 in FIG. 2k, the patterned cells, which include the layers 218, 222, 226, 234 are encapsulated by electrically insulating layer 244 such as silicon oxide ($SiO_2$) or silicon nitride ($Si_3N_4$).

In case the trenches 242 are overfilled with the isolating material 244, the overfilling material is removed by means of a CMP process (not shown in the figures). The patterned hard mask layer 234 is connected to a top interconnect metal line (not shown in the figures).

In order to complete the CBRAM array, common steps are used for forming word line elements and bit line elements and their respective contact portions and, if desired, those respective passivation (not shown in the figures).

In an alternative embodiment of the invention, a common top plate is provided on the cell block instead of patterning individual cell as described in the embodiment according to FIGS. 2a to 2k.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A solid state electrolyte memory structure, comprising:
   a solid state electrolyte layer;
   a metal layer over and in physical contact with the solid state electrolyte layer;
   an etch stop layer over and in physical contact with the metal layer; and
   a hard mask layer on the etch stop layer.

2. The solid state electrolyte memory structure of claim 1, wherein the hard mask layer comprises a metal hard mask layer.

3. The solid state electrolyte memory structure of claim 1, wherein the metal hard mask layer comprises titanium, titanium nitride, tantalum, or tantalum nitride or a combination of these materials.

4. The solid state electrolyte memory structure of claim 1, wherein the solid state electrolyte layer comprises a chalcogenide material.

5. The solid state electrolyte memory structure of claim 4, wherein the chalcogenide material contains metal ions.

6. The solid state electrolyte memory structure of claim 5, wherein the metal ions are selected from the group consisting of silver, copper, zinc and combinations or alloys thereof.

7. The solid state electrolyte memory structure of claim 4, wherein the chalcogenide material comprises a material selected from the group consisting of sulfur, selenium, germanium, tellurium, tungsten, and combinations or alloys thereof.

8. The solid state electrolyte memory structure of claim 1, wherein the metal layer comprises a material containing silver.

9. The solid state electrolyte memory structure of claim 1, wherein the etch stop layer comprises a material that has a high etch resistance to a hard mask etch chemistry.

10. The solid state electrolyte memory structure of claim 1, wherein the etch stop layer also serves as a diffusion barrier for the metal layer.

11. The solid state electrolyte memory structure of claim 1, wherein the etch stop layer comprises a material selected from the group consisting of Ru, NiFe, NiFeCr, Pt, PtMn, Ir, IrMn, and combinations or alloys thereof.

12. A memory structure, comprising:
    an ion conducting material layer;
    a metal layer in physical contact with the ion conducting material layer;
    an etch stop layer in physical contact with the metal layer; and
    a hard mask layer on the etch stop layer.

13. The memory structure of claim 12, wherein the hard mask layer comprises a metal hard mask layer.

14. The memory structure of claim 13, wherein the metal hard mask layer comprises at least one of titanium, titanium nitride, tantalum, and/or tantalum nitride.

15. The memory structure of claim 12, wherein the ion conducting material layer comprises a chalcogenide material.

16. The memory structure of claim 14, wherein the ion conducting material layer comprises GeS, GeSe, or WOx.

17. The memory structure of claim 12, wherein the metal layer comprises a material containing silver.

18. The memory structure of claim 12, the etch stop layer comprises a material selected from the group consisting of Ru, NiFe, NiFeCr, Pt, PtMn, Ir, IrMn, and combinations or alloys thereof.

19. A solid state electrolyte memory structure, comprising:
    a solid state electrolyte layer made of a chalcogenide material;

a silver layer in physical contact with the solid state electrolyte layer;

an etch stop layer in physical contact with the silver layer, the etch stop layer being made from a material selected from the group consisting of Ru, NiFe, NiFeCr, Pt, PtMn, Ir, and IrMn; and a metal hard mask layer in physical contact with the etch stop layer.

20. The solid state electrolyte memory structure of claim 19, wherein the metal hard mask layer comprises titanium, titanium nitride, tantalum, or tantalum nitride.

* * * * *

UNITED STATES PATENT AND TRADEMARK OFFICE
CERTIFICATE OF CORRECTION

PATENT NO. : 7,423,282 B2 Page 1 of 1
APPLICATION NO. : 11/483264
DATED : September 9, 2008
INVENTOR(S) : Park et al.

It is certified that error appears in the above-identified patent and that said Letters Patent is hereby corrected as shown below:

On the Title Page, Item (75) Inventors, 3rd entry, delete "Fontainebleau (FR)" and insert --Landshut, (DE)--.
On the Title Page, Item (73) Assignees, 2nd entry, delete "Atlis" and insert --Altis--.
In Col. 6, line 57, delete "14" and insert --15--.

Signed and Sealed this

Twentieth Day of January, 2009

JON W. DUDAS
*Director of the United States Patent and Trademark Office*